(12) United States Patent
Liu et al.

(10) Patent No.: US 9,871,371 B2
(45) Date of Patent: Jan. 16, 2018

(54) BATTERY SHORT-CIRCUIT PROTECTION CIRCUIT

(71) Applicant: Hefei University of Technology, Hefei-Anhui (CN)

(72) Inventors: Xintian Liu, Hefei (CN); Yao He, Hefei (CN); Xinxin Zheng, Hefei (CN); Guojian Zeng, Hefei (CN)

(73) Assignee: Heifei University of Technology (CN)

( * ) Notice: Subject to any disclaimer, the term of this patent is extended or adjusted under 35 U.S.C. 154(b) by 110 days.

(21) Appl. No.: 14/939,305

(22) Filed: Nov. 12, 2015

(65) Prior Publication Data

US 2017/0025843 A1    Jan. 26, 2017

(30) Foreign Application Priority Data

Jul. 23, 2015   (CN) .......................... 2015 1 0443886

(51) Int. Cl.
| | |
|---|---|
| *H02H 3/00* | (2006.01) |
| *H02H 3/087* | (2006.01) |
| *H02J 7/00* | (2006.01) |
| *B60L 3/04* | (2006.01) |
| *F02D 41/20* | (2006.01) |
| *H01L 27/02* | (2006.01) |

(52) U.S. Cl.
CPC .......... *H02H 3/087* (2013.01); *H02J 7/0031* (2013.01); *B60L 3/04* (2013.01); *F02D 2041/2093* (2013.01); *H01L 27/0251* (2013.01); *H02J 7/007* (2013.01); *H02J 2007/0039* (2013.01)

(58) Field of Classification Search
USPC ............................................ 361/86–87, 101
See application file for complete search history.

(56) References Cited

U.S. PATENT DOCUMENTS

2010/0141215 A1*  6/2010  Takeda .................. H01M 10/48
                                                   320/136
2012/0212871 A1*  8/2012  Taniguchi .......... G01R 31/3624
                                                   361/87

FOREIGN PATENT DOCUMENTS

| CN | 2768266 | 3/2006 |
|---|---|---|
| CN | 102709882 | 10/2012 |
| CN | 0N200398750 | 1/2014 |
| JP | H11187578 | 7/1999 |
| JP | 2002078210 | 3/2002 |

* cited by examiner

*Primary Examiner* — Danny Nguyen
(74) *Attorney, Agent, or Firm* — Dickinson Wright PLLC

(57) ABSTRACT

This invention involves a battery short-circuit protection circuit installed in a battery-load circuit. In the battery-load circuit, there is a battery and a load RL. The battery and RL form a circuit. The two ends of the battery are positive discharge end P+ and negative discharge end P−, respectively. The battery short-circuit protection circuit is in series with the battery-load circuit. The battery short-circuit protection circuit includes a charge-discharge circuit, a current amplifier circuit, and a current comparator circuit. The charge-discharge circuit includes MOS transistors and a sampling resistor. The current amplifier circuit includes a signal conditioning circuit and a current amplifier. The current comparator circuit includes a current comparator, a current reference circuit for short-circuit protection consisting, a MOS transistor, a diode, a resistor, and an optronics relay.

1 Claim, 4 Drawing Sheets

BATTERY SHORT-CIRCUIT PROTECTION CIRCUIT

FIELD OF THE INVENTION

This invention involves the field of protection-circuit technology, in particular, a battery short-circuit protection circuit.

BACKGROUND TECHNOLOGIES

Among the existing technologies, batteries as backup power sources have been used extensively in many areas such as communications, electrical power systems, military equipment, and electric vehicles. As environmental friendly energy sources gradually gained attention and support from people, batteries are being used in more and more systems as the main power supplies. Among these systems, lithium-ion batteries already became the mainstream power sources for the new energy vehicles. The battery's working condition, whether good or poor, directly affects the operational reliability of the entire system.

If the lithium battery is short-circuited, it can lead to situations such as fluid leakage, spontaneous combustion, and even explosion, endangering the battery itself, the electric vehicle, and even personal safety.

The purpose of a battery short-circuit device is to automatically disconnect the battery circuit within the shortest time period when detecting a battery short-circuit condition through a short-circuit protection circuit, thus protecting the battery. The most common battery short-circuit protection method is to compare the sampling current value with the software reference. When the sampling current value is higher than the short-circuit protection reference, the software controls the discharging MOS switch to be disconnected in order to achieve short-circuit protection. The weakness of the above method is that the response time is relatively slow, and the sustained high current through the MOS can easily cause damage to the MOS. In addition, once the software becomes ineffective, the entire system will collapse.

SUMMARY OF THE INVENTION

This invention addresses the inadequacy of the existing technologies and proposes a new technical solution.

The battery short-circuit protection circuit is installed in a battery-load circuit. In the battery-load circuit, there is a battery and a load RL. The battery and RL form a circuit. The two ends of the battery are positive discharge end P+ and negative discharge end P−, respectively. The battery short-circuit protection circuit is in series with the battery-load circuit. The battery short-circuit protection circuit includes a charge-discharge circuit, a current amplifier circuit, and a current comparator circuit. The charge-discharge circuit includes MOS transistors Q1, Q2, Q3, Q4, and a sampling resistor R7. The current amplifier circuit includes a signal conditioning circuit and a current amplifier U1B. The current comparator circuit includes a current comparator U3A, a current reference circuit for short-circuit protection consisting of R18 and R20, a MOS transistor Q6, a diode D7, a resistor R17, and an optronics relay U2.

The load end DCHG− of the discharge circuit is consecutively in series with the charging MOS transistor Q3 and discharging MOS transistor Q4. The discharging MOS transistor Q4 is connected with the discharging MOS transistor driver circuit consisting of the MOS transistors Q1 and Q2, and the sampling resistor R7, respectively. The sampling resistor R7 is connected with the negative discharge end P−. At the two ends of the sampling resistor R7, there are two output ports, Is+ and Is−, set up respectively, in order to sample the current in the battery-load circuit at the time. The output ports, Is+ and Is−, are connected with the current amplifier U1B through the signal conditioning circuit (10). The current amplifier U1B's current output port exports current sampling value CurrentSampCout. The current output port sends the current sampling value CurrentSampCout to the current comparator U3A. The current comparator U3A is connected with the current reference circuit connection for short-circuit protection consisting of R18 and R20, and consecutively connected in series with MOS transistor Q6, diode D7, resistor R17, and optronics relay U2. The optronics relay U2 includes pin 1 for connecting power VCC, pin 2 for connecting resistor R17, pin 3 for ground connection, and pin 4 for connecting the discharging MOS transistor driver circuit consisting of the MOS transistors Q1 and Q2. The pin 1 and pin 2 are connected with photosensitive resistor in the optronics relay U2. The pin 3 and pin 4 are connected with the sensing stage in the optronics relay U2.

Through the current comparator U3A, the output current sampling value CurrentSampCout is compared with the short-circuit protection reference current in the current reference circuit for short-circuit protection consisting of R18 and R20. If the current sampling value CurrentSampCout is higher than the short-circuit protection reference current, then pin 1 of the current comparator U3A outputs high voltage level to turn on the MOS transistor Q6, which turns on the circuit connecting power VCC, optronics relay U2, resistor R17, diode D7. MOS transistor Q6 and ground connector GND. Pin 3 and pin 4 of the optronics relay U2 are short circuited. Pin 4 outputs low voltage level. When the discharge circuit consisting of MOS transistors Q1 and Q2 receives the low voltage level signal, the discharging MOS transistor Q4 disconnects, the remaining charge discharges through MOS transistor Q2, which means the battery circuit is disconnected and the short-circuit protection is achieved.

This invention has a simple and reasonable structure. This invention adopts an all-hardware design for short-circuit protection circuit, samples and compares the current value in real time with fast protection response speed. And since this circuit does not involve a software component, the software failure problem is avoided.

DETAILED DESCRIPTION

The following describes contents of this invention with a specific implementation case.

Figure 1:
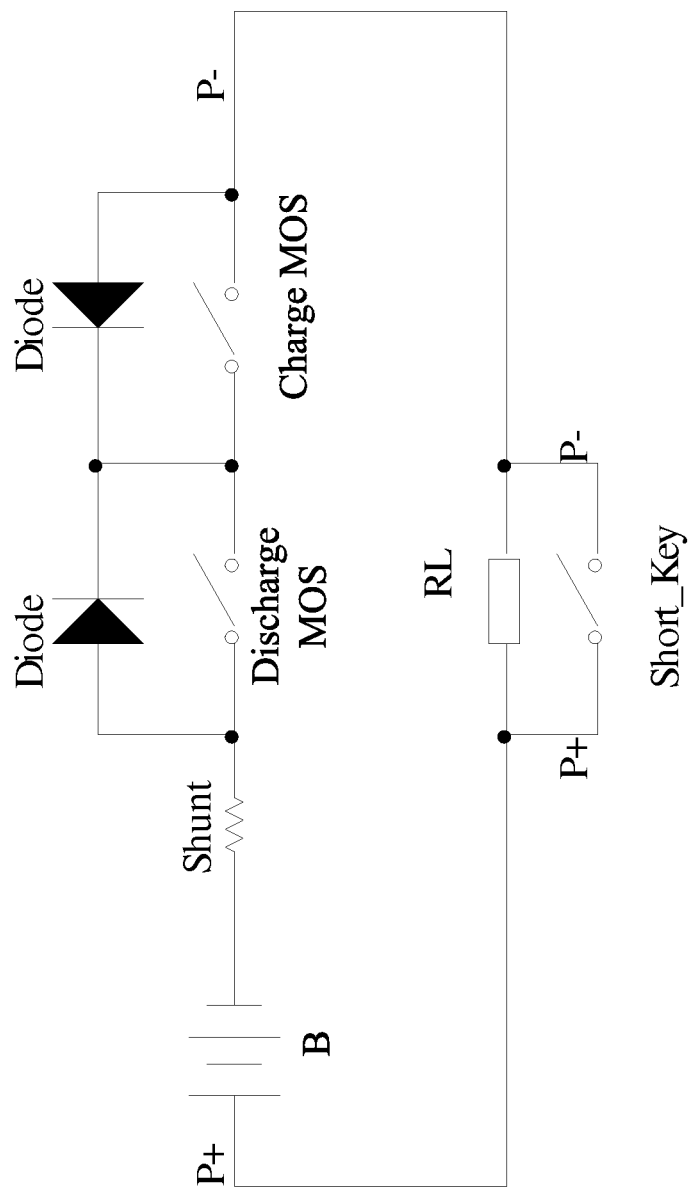
FIG. 1 is the schematic diagram illustrating the battery short-circuit protection circuit of the invention.
Figure 2:
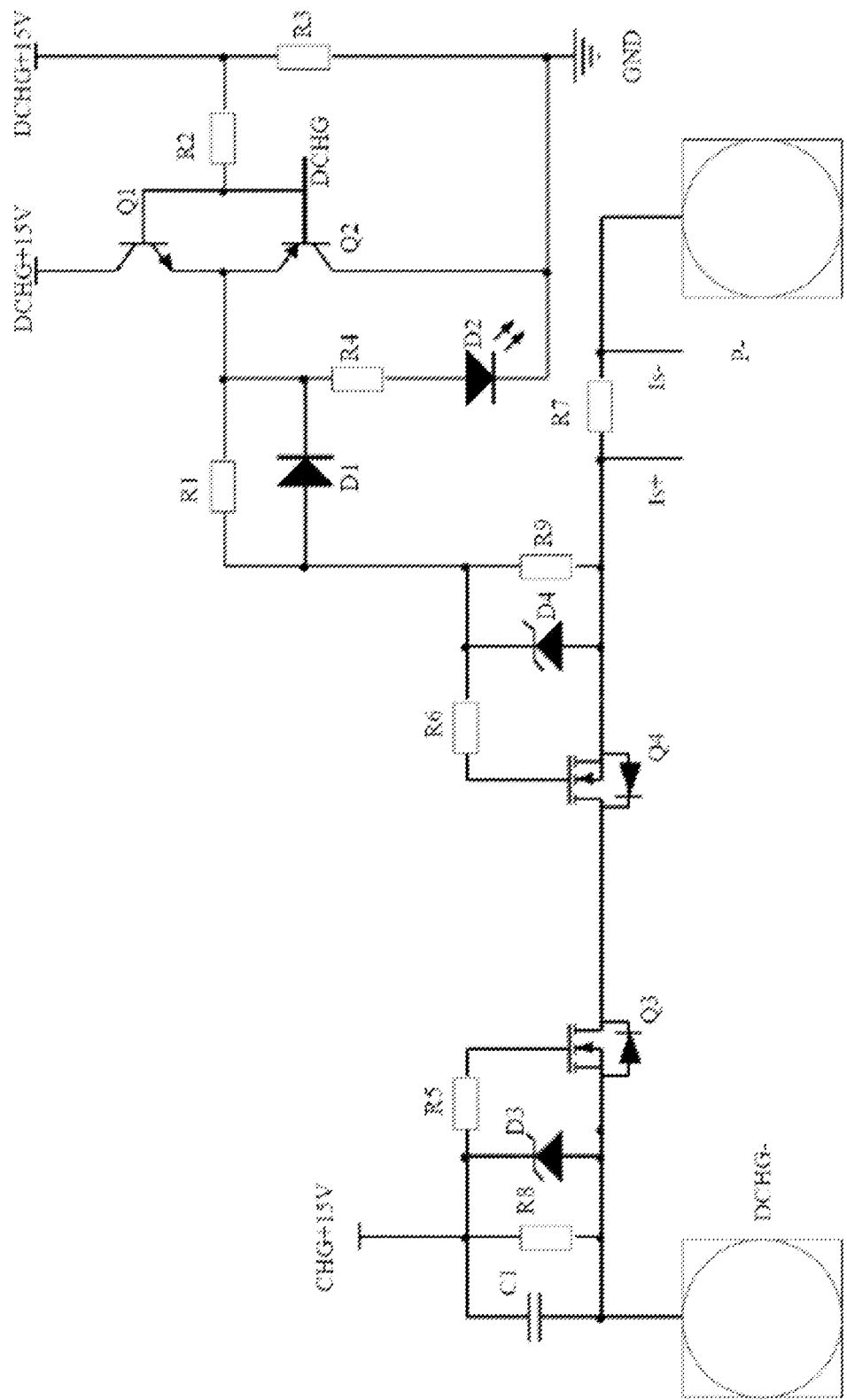
FIG. 2 is the circuit diagram for the charge-discharge circuit in the battery short-circuit protection circuit of the invention.
Figure 3:
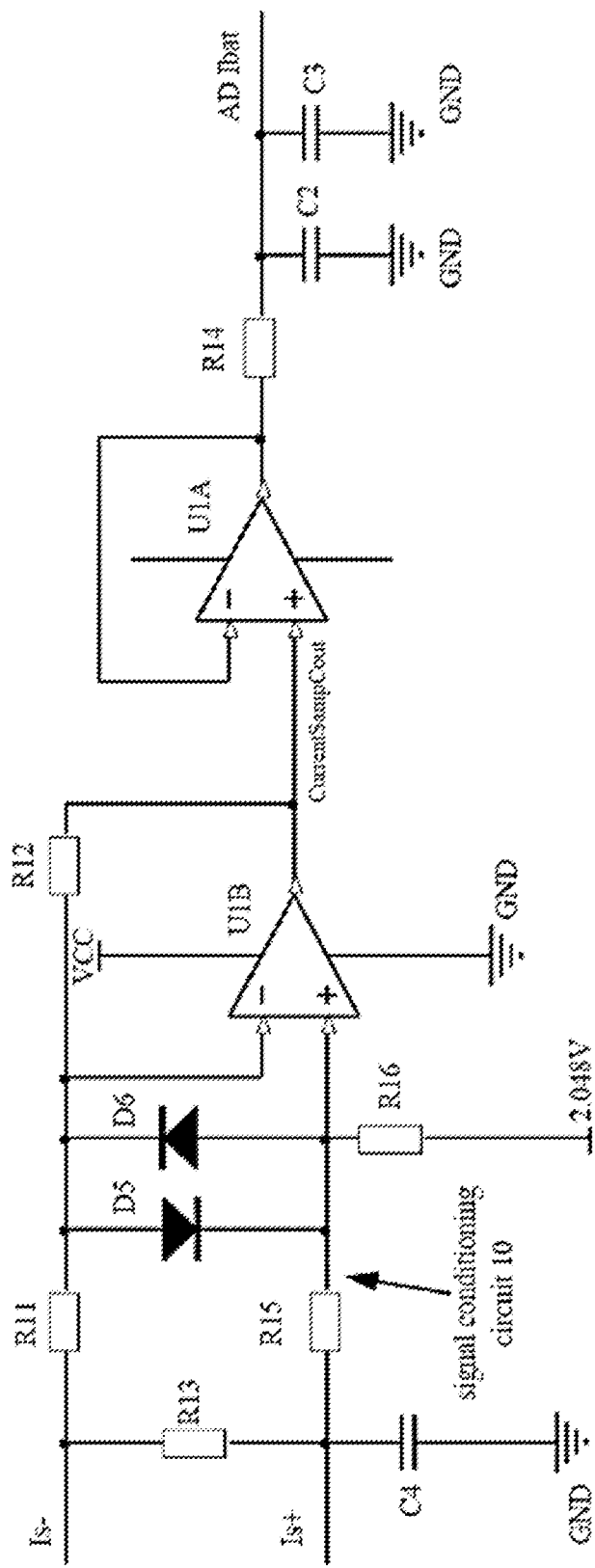
FIG. 3 is the circuit diagram for the current amplifier circuit in the battery short-circuit protection circuit of the invention.
Figure 4:
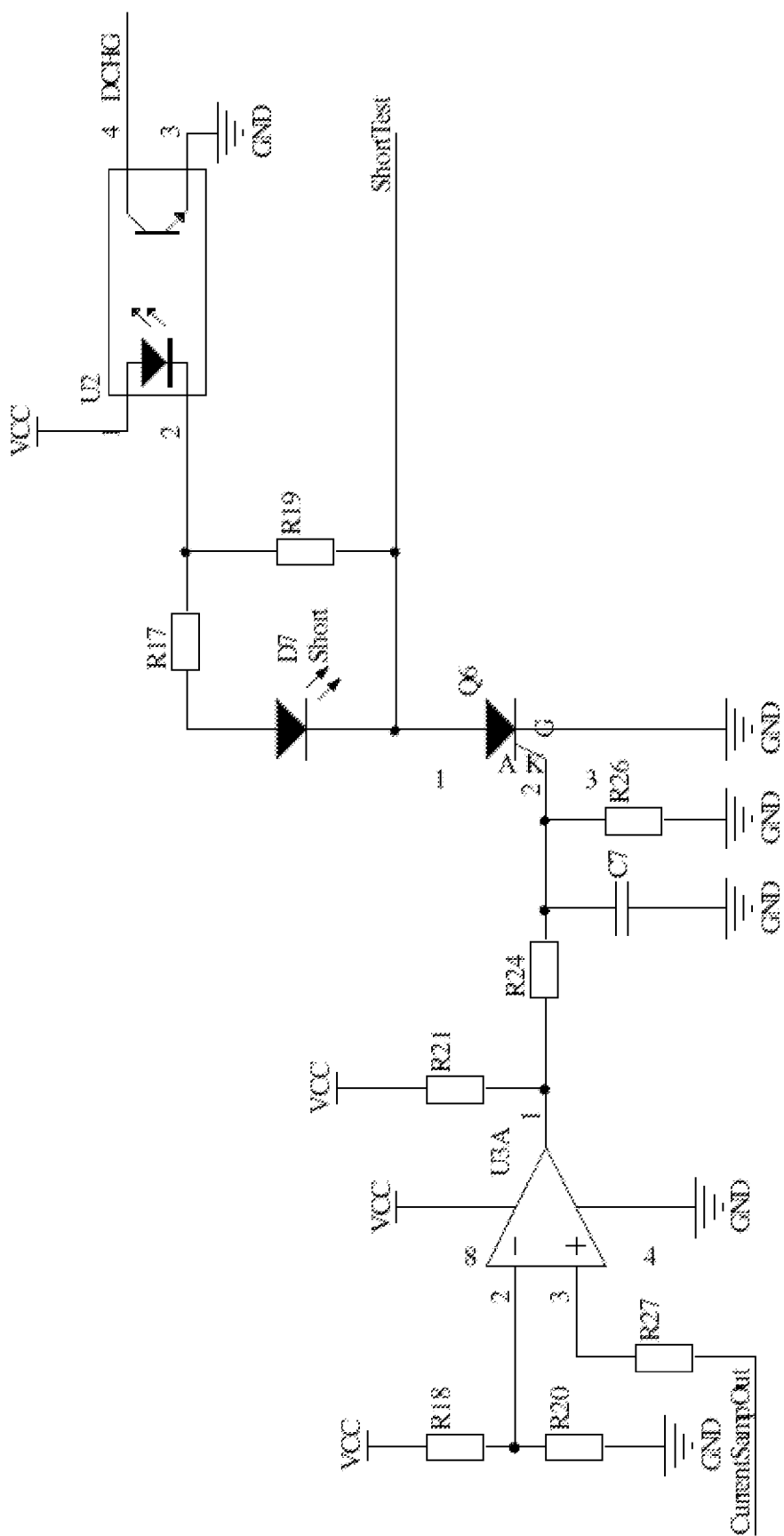
FIG. 4 is the circuit diagram for the current comparator circuit in the battery short-circuit protection circuit of the invention.

Please reference FIG. 1 through FIG. 4 together. FIG. 1 is the schematic diagram illustrating the principle of the battery short-circuit protection circuit of this invention. FIG. 2 is the circuit diagram for the charge-discharge circuit in the battery short-circuit protection circuit of this invention. FIG. 3 is the circuit diagram for the current amplifier circuit in the battery short-circuit protection circuit of this invention. FIG. 4 is the circuit diagram for the current comparator circuit in the battery short-circuit protection circuit of this invention.

The battery short-circuit protection circuit is installed in a battery-load circuit. In the battery-load circuit, there is a battery and a load RL. The battery and RL form a circuit. The two ends of the battery are positive discharge end P+ and negative discharge end P−, respectively. The battery short-circuit protection circuit is in series with the battery-load circuit. The battery short-circuit protection circuit includes a charge-discharge circuit, a current amplifier circuit, and a current comparator circuit. The charge-discharge circuit includes MOS transistors Q1, Q2, Q3, Q4, and a sampling resistor R7. The current amplifier circuit includes a signal conditioning circuit 10 and a current amplifier U1B. The current comparator circuit includes a current comparator U3A, a current reference circuit for short-circuit protection consisting of R18 and R20, a MOS transistor Q6, a diode D7, a resistor R17, and an optronics relay U2.

The load end DCHG− of the discharge circuit is consecutively in series with the charging MOS transistor Q3 and discharging MOS transistor Q4. The discharging MOS transistor Q4 is connected with the discharging MOS transistor driver circuit consisting of the MOS transistors Q1 and Q2, and the sampling resistor R7, respectively. The sampling resistor R7 is connected with the negative discharge end P−. At the two ends of the sampling resistor R7, there are two output ports, Is+ and Is−, set up respectively, in order to sample the current in the battery-load circuit at the time. The output ports, Is+ and Is−, are connected with the current amplifier U1B through the signal conditioning circuit (10). The current amplifier U1B's current output port exports current sampling value CurrentSampCout. The current output port sends the current sampling value CurrentSampCout to the current comparator U3A. The current comparator U3A is connected with the current reference circuit connection for short-circuit protection consisting of R18 and R20, and consecutively connected in series with MOS transistor Q6, diode D7, resistor R17, and optronics relay U2. The optronics relay U2 includes pin 1 for connecting power VCC, pin 2 for connecting resistor R17, pin 3 for ground connection, and pin 4 for connecting the discharging MOS transistor driver circuit consisting of the MOS transistors Q1 and Q2. The pin 1 and pin 2 are connected with photosensitive resistor in the optronics relay U2. The pin 3 and pin 4 are connected with the sensing stage in the optronics relay U2.

Through the current comparator U3A, the output current sampling value CurrentSampCout is compared with the short-circuit protection reference current in the current reference circuit for short-circuit protection consisting of R18 and R20. If the current sampling value CurrentSampCout is higher than the short-circuit protection current setting, then pin 1 of the current comparator U3A outputs high voltage level to turn on the MOS transistor Q6, which turns on the circuit connecting power VCC, optronics relay U2, resistor R17, diode D7, MOS transistor Q6 and ground connector GND. Pin 3 and pin 4 of the optronics relay U2 are short circuited. Pin 4 outputs low voltage level. When the discharge circuit consisting of MOS transistors Q1 and Q2 receives the low voltage level signal, the discharging MOS transistor Q4 disconnects, the remaining charge discharges through MOS transistor Q2, which means the battery circuit is disconnected and the short-circuit protection is achieved.

This invention has a simple and reasonable structure. This invention adopts an all-hardware design for short-circuit protection circuit, samples and compares the current value in real time with fast protection response speed. And since this circuit does not involve a software component, the software invalid problem is avoided.

The invention claimed is:

1. In a battery-load circuit including a load RL and a battery having a positive discharge end and a negative discharge end, a battery short-circuit protection circuit m series with the battery-load circuit, the battery short-circuit protection circuit comprising:
   a current amplifier circuit including a signal conditioning circuit and a current amplifier;
   a charge-discharge circuit including MOS transistors and a sampling resistor, the sampling resistor connected with the battery negative discharge end in order to sample the current in the battery-load circuit, and the sampling resistor connected with the current amplifier through the signal conditioning circuit; and
   a current comparator circuit including a current comparator and a current reference circuit, the current reference circuit comprising a MOS transistor, a diode, a resistor, and an optronics relay, the current comparator connected with the current reference circuit connection and consecutively connected in series with the MOS transistor, diode, resistor, and optronics relay, and wherein the optronics relay includes a pin for connecting power, a pin for connecting the resistor, a pin for a ground connection, and a pin for connecting the a charge-discharge circuit;
   wherein the current amplifier outputs a current sampling value to the current comparator;
   wherein the current comparator compares the output current sampling value with the short-circuit protection current reference in the current reference circuit and, if the current sampling value is higher than the short-circuit protection reference current, the current comparator outputs a high voltage level to turn on the MOS transistor, which turns on the circuit connecting power, optronics relay, resistor, diode, MOS transistor and ground connector, the optronics relay pins for the ground connection and for connecting the a charge-discharge circuit are short circuited, and the pin for connecting the charge-discharge circuit outputs a low voltage level; and
   when the charge-discharge circuit receives the low voltage level signal, the charge-discharge disconnects and the remaining charge discharges through the charge-discharge, thereby disconnecting the battery circuit.

* * * * *